(12) United States Patent
Yoshioka

(10) Patent No.: US 8,362,940 B2
(45) Date of Patent: Jan. 29, 2013

(54) SUCCESSIVE APPROXIMATION REGISTER ANALOG-TO-DIGITAL CONVERTER, AND OPERATING CLOCK ADJUSTMENT METHOD THEREFOR

(75) Inventor: Masato Yoshioka, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 41 days.

(21) Appl. No.: 13/197,931

(22) Filed: Aug. 4, 2011

(65) Prior Publication Data

US 2012/0032824 A1  Feb. 9, 2012

(30) Foreign Application Priority Data

Aug. 9, 2010 (JP) ................................. 2010-178939

(51) Int. Cl.
*H03M 1/34* (2006.01)
(52) U.S. Cl. .......................... 341/163; 341/118; 341/155
(58) Field of Classification Search .................. 341/118, 341/155, 163
See application file for complete search history.

(56) References Cited

U.S. PATENT DOCUMENTS

| | | | |
|---|---|---|---|
| 4,654,584 A * | 3/1987 | Gyles | 324/76.13 |
| 5,870,052 A * | 2/1999 | Dedic et al. | 341/161 |
| 6,400,302 B1 * | 6/2002 | Amazeen et al. | 341/172 |
| 7,106,237 B1 * | 9/2006 | Confalonieri et al. | 341/155 |
| 7,576,678 B2 * | 8/2009 | Chatal et al. | 341/163 |
| 8,193,957 B2 * | 6/2012 | Yoshioka | 341/118 |
| 2009/0009373 A1 * | 1/2009 | Yoshinaga | 341/143 |

OTHER PUBLICATIONS

Yoshioka, Masato et al.,""A 10b 50MS/s 820µW SAR ADC with On-Chip Digital Calibration," 2010 IEEE International Solid-State Circuits Conference, Digest of Technical Papers, pp. 384-385", Feb. 10, 2010; pp. 384-385.

* cited by examiner

*Primary Examiner* — Khai M Nguyen
(74) *Attorney, Agent, or Firm* — Fujitsu Patent Center

(57) ABSTRACT

A successive approximation register analog-to-digital converter includes: a digital-to-analog converter to generate an analog voltage based on an input voltage sampled in accordance with a sampling clock and a digital code; a comparator to receive the analog voltage; a controller to generate the digital code based on an output of the comparator; a delay circuit to delay a signal based on the output of the comparator and to feed back the delayed signal to a reset terminal of the comparator; an adjustment circuit to count a number of edges of a signal generated in a loop that feeds back the delayed signal, and to adjust an amount of delay of the delay circuit based on a count value; and a sampling clock generation circuit to generate the sampling clock based on the signal generated in the loop and the external clock signal.

20 Claims, 16 Drawing Sheets

SUCCESSIVE APPROXIMATION REGISTER ANALOG-TO-DIGITAL CONVERTER, AND OPERATING CLOCK ADJUSTMENT METHOD THEREFOR

CROSS-REFERENCE TO RELATED APPLICATIONS

This application claims the benefit of priority from Japanese Patent Application No. 2010-178939 filed on Aug. 9, 2010, the entire contents of which are incorporated herein by reference.

BACKGROUND

1. Field

The embodiments discussed herein relate to a successive approximation register analog-to-digital (AD) converter.

2. Description of Related Art

A successive approximation register analog-to-digital (AD) converter includes a digital-to-analog converter (DAC), a comparator, and a DAC control circuit. The successive approximation register AD converter samples an input voltage during a sampling period, holds the sampled voltage, and successively compares the sampled voltage with voltages to be compared during a comparison period that follows the sampling period. A plurality of voltages to be compared are generated in certain increments, i.e., ½ Vref, ¼ Vref, ⅛ Vref, . . . , in accordance with digital codes from the DAC control circuit. Vref may be a reference voltage. The comparator compares the voltages to be compared, which correspond to the digital codes, with the sampled voltage. The DAC control circuit changes a digital code in accordance with the comparison results of the comparator. A comparison operation is performed successively N times with the value of a voltage to be compared changing from a large value to a small value. An N-bit digital code corresponding to the sampled voltage is determined by the N-times successive comparison operations.

A related art is disclosed in, for example, Masato Yoshioka, Kiyoshi Ishikawa, Takeshi Takayama, and Sanroku Tsukamoto in "A 10b 50MS/s 820 μW SAR ADC with On-Chip Digital Calibration," 2010 IEEE International Solid-State Circuits Conference, Digest of Technical Papers, pp. 384-385.

SUMMARY

According to one aspect of the embodiments, a successive approximation register analog-to-digital converter includes: a digital-to-analog converter to generate an analog voltage based on an input voltage and a digital code, the input voltage being sampled in accordance with a sampling clock; a comparator to receive the analog voltage; a controller to generate the digital code based on an output of the comparator; a delay circuit to delay a signal based on the output of the comparator and to feed back the delayed signal to a reset terminal of the comparator; an adjustment circuit to count a number of edges of a signal generated in a loop that feeds back the delayed signal during a period having an integer multiple of a cycle of an external clock signal, and to adjust an amount of delay of the delay circuit based on a count value; and a sampling clock generation circuit to generate the sampling clock based on the signal generated in the loop and the external clock signal.

Additional advantages and novel features of the invention will be set forth in part in the description that follows, and in part will become more apparent to those skilled in the art upon examination of the following or upon learning by practice of the invention.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
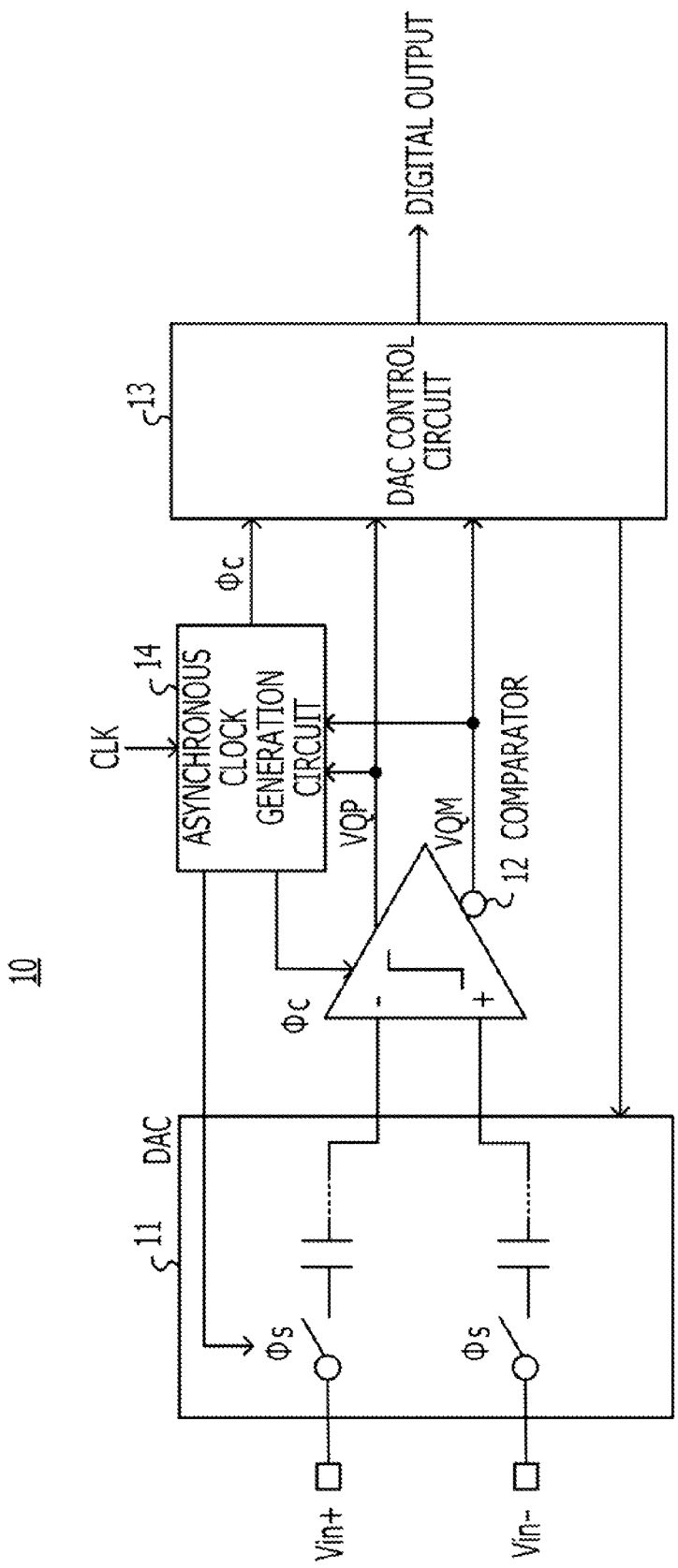
FIG. 1 illustrates an exemplary successive approximation register AD converter.

In a successive approximation register AD converter, a DAC includes a capacitor DAC, or a capacitor main DAC and a resistor sub DAC. In the capacitor DAC, input voltages are applied to a plurality of capacitors in parallel during a sampling period, and the capacitors are charged to voltages substantially equal to the input voltages. After sampling, connections of the plurality of capacitors are switched by a switching circuit. For example, one end of each of the plurality of capacitors may be selectively coupled to Vref or GND, and the other end may be coupled to a common terminal. Electric charge is redistributed, and a potential corresponding to the input voltage and the voltage obtained by dividing the capacitance between Vref and GND appears at the common terminal. The voltage at the common terminal is input to a comparator. The connection of the switching circuit is controlled using a digital code from a DAC control circuit, and a voltage to be compared is generated.

In a synchronous successive approximation register AD converter, a DAC, a comparator, and a DAC control circuit operate in synchronization with an external clock signal. The external clock signal may have a higher rate than a clock signal for sampling. For example, in AD conversion with N-bit resolution, the external clock signal may have a frequency that is N times or more the sampling frequency. A system chip may have a specific clock generation source dedicated to ADC, which uses a phase locked loop (PLL) or the like.

In an asynchronous successive approximation register AD converter, a DAC, a comparator, and a DAC control circuit operate in synchronization with a clock signal that is generated in accordance with changes in the output of the comparator. The output of the comparator is input to an asynchronous clock generation circuit, and the output of the asynchronous clock generation circuit is input to the comparator as a reset signal. Thus, a loop is formed. A clock signal is generated through self-excitation in the loop. For example, a delay circuit delays a pulse signal that is generated based on the output of the comparator, and the delayed pulse signal is input to a reset terminal of the comparator.

When the delay circuit includes a delay element array having a gate circuit such as an inverter, the amount of delay may vary depending on the variation in process, temperature, or power supply voltage. When the amount of delay increases in accordance with the changes and one cycle of a self-excited clock may increase, the comparison operation may not be executed a certain number of times within a certain sampling cycle, for example, N times for N-bit resolution. When the amount of delay decreases in accordance with the changes, one cycle of a self-excited clock may decrease and the operation of the DAC, the comparator, and the DAC control circuit may not follow the clock speed.

The variation of delay within the delay circuit may be adjusted using a PLL and a delay locked loop (DLL).

In an asynchronous successive approximation register AD converter, a sampling clock for setting a sampling cycle, or a sampling period or a comparison period in a cycle may be used. When the sampling frequency of the successive approximation register AD converter increases, the length of the sampling period may become shorter than that of the comparison period, and the duty ratio of the sampling clock may be reduced.

FIG. 1 illustrates an exemplary successive approximation register AD converter. A successive approximation register AD converter 10 illustrated in FIG. 1 includes a DAC 11, a comparator 12, a DAC control circuit 13, and an asynchronous clock generation circuit 14. The DAC 11 generates an analog voltage based on a sampled input voltage and a digital code from the DAC control circuit 13 in accordance with a sampling clock Ps. The comparator 12 receives the analog voltage output from the DAC 11, and performs a comparison operation. The DAC control circuit 13 successively changes the digital code in accordance with comparison results obtained from the comparator 12, and generates digital codes corresponding to the sampled input voltage. The DAC 11 of the successive approximation register AD converter 10 illustrated in FIG. 1 may be a capacitor DAC. A differential signal may be input to and output from the DAC 11 and the comparator 12. For example, the DAC 11 may be a resistor DAC and may be a DAC circuit including a capacitor main DAC and a resistor sub DAC. A single-phase signal may be input to and output from the DAC 11 and the comparator 12.

The capacitor DAC 11 stores analog input voltages Vin+ and Vin− in internal capacitors in a period during which the sampling clock $\Phi_s$ is at a high level, for example, in a sampling period. For example, an input voltage Vin+ is applied in parallel to a plurality of positive-side capacitors, and each of the capacitors is charged to a voltage corresponding to the input voltage Vin+. After the completion of sampling, the coupling of the plurality of positive-side capacitors is switched by a switching circuit. For example, one end of each of the plurality of capacitors may be selectively coupled to one of a positive reference voltage Vref+ and a negative reference voltage Vref−, and the other end may be coupled to a positive-side common terminal. Electric charge is redistributed, and a voltage corresponding to the input voltage Vin+ and the voltage obtained by dividing the capacitance between Vref+ and Vref− appears at the positive-side common terminal. An input voltage Vin− is applied in parallel to a plurality of negative-side capacitors, and each of the capacitors is charged to a voltage corresponding to the input voltage Vin−. After the completion of sampling, the coupling of the plurality of negative-side capacitors is switched by a switching circuit. For example, one end of each of the plurality of capacitors may be selectively coupled to one of a positive reference voltage Vref+ and a negative reference voltage Vref−, and the other end may be coupled to a negative-side common terminal. Electric charge is redistributed, and a voltage corresponding to the input voltage Vin− and the voltage obtained by dividing the capacitance between Vref+ and Vref− appears at the negative-side common terminal. The voltage at the positive-side common terminal and the voltage at the negative-side common terminal are input to the comparator 12. The coupling of the switching circuits may be controlled using a digital code from the DAC control circuit 13, and a voltage to be compared may be generated. The two input terminals of the comparator 12 may be short-circuited to each other during the sampling period.

A pulse signal $\Phi_c$ generated by the asynchronous clock generation circuit 14 is input to a reset terminal of the comparator 12. The pulse signal $\Phi_c$ is also supplied to the DAC control circuit 13. The individual units of the successive approximation register AD converter 10 may perform a successive comparison operation in synchronization with the pulse signal $\Phi_c$. The pulse signal $\Phi_c$ may not be synchronized with an external clock signal $\Phi_s$. The circuit 14 that generates the pulse signal $\Phi_c$ may be an asynchronous clock generation circuit. The comparator 12 performs a comparison operation during a period during which, for example, the pulse signal $\Phi_c$ is at a high level, and stops the comparison operation (or is reset) during a period during which, for example, the pulse signal Pc is at a low level. Two outputs VQP and VQM of the comparator 12 may have different voltages in accordance with a comparison result during a period during which, for example, the pulse signal Pc is at a high level, and may have substantially the same voltage during a period during which, for example, the pulse signal Pc is at a low level.

In accordance with the outputs VQP and VQM of the comparator 12, the DAC control circuit 13 changes a digital code in synchronization with the pulse signal $\Phi_c$, for example, in synchronization with an edge of the pulse signal $\Phi_c$. The comparator 12 performs a comparison operation in response to a change in the coupling of the switching circuits in the DAC 11. The DAC control circuit 13 changes a digital code during the successive comparison operation, thereby reducing the difference between the two output voltages of the DAC 11 in increments corresponding to ½, ¼, ⅛, . . . a reference voltage (for example, a difference voltage between Vref+ and Vref−). In this manner, the DAC control circuit 13 retrieves a digital code (switch conditions) corresponding to the difference between the analog input potentials Vin+ and Vin−.

Figure 2:
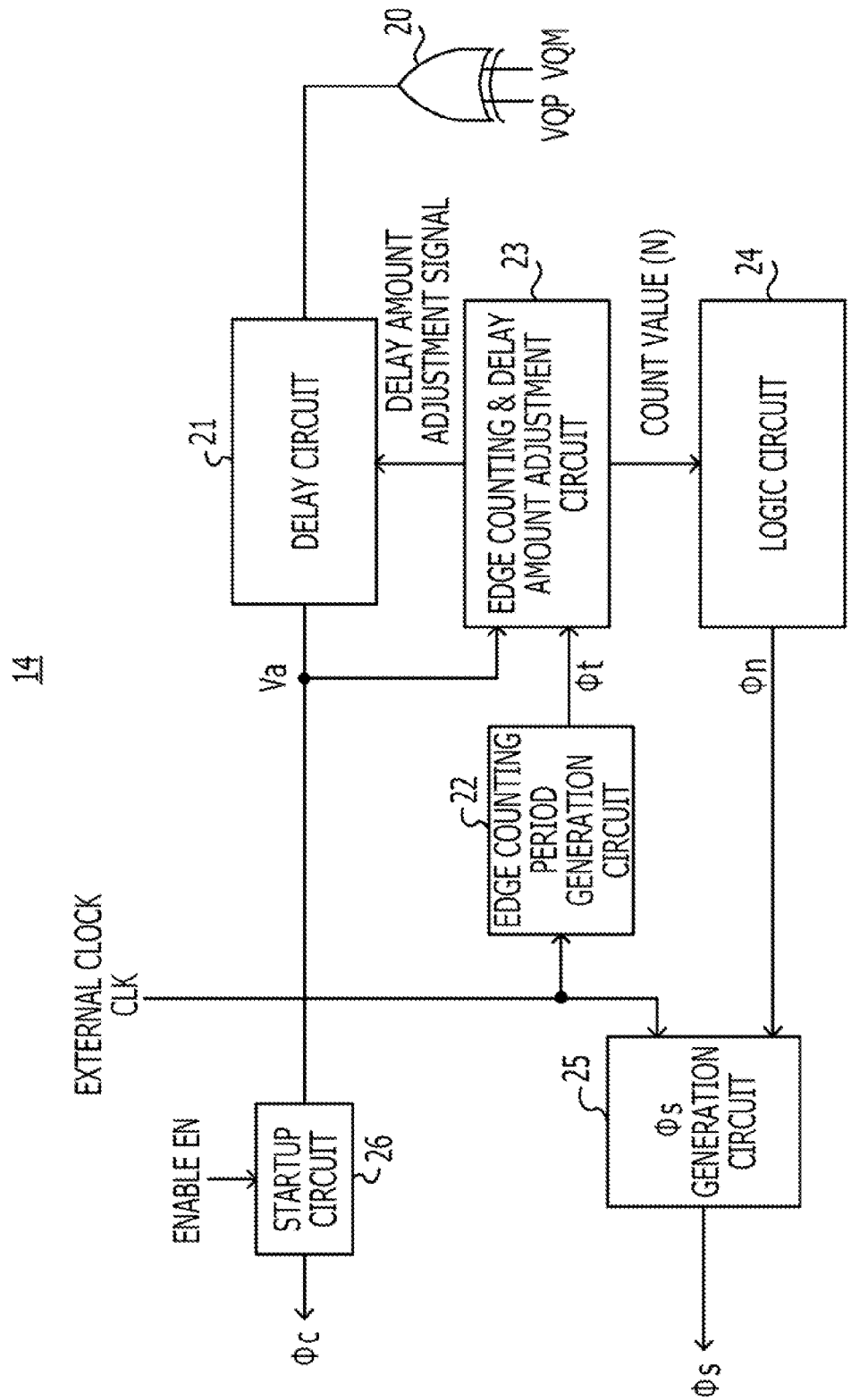
FIG. 2 illustrates an exemplary asynchronous clock generation circuit.

FIG. 2 illustrates an exemplary asynchronous clock generation circuit. An asynchronous clock generation circuit 14 illustrated in FIG. 2 includes an exclusive OR (XOR) circuit 20, a delay circuit 21, an edge counting period generation circuit 22, an edge counting & delay amount adjustment circuit 23, a logic circuit 24, a $\Phi_s$ generation circuit 25, and a startup circuit 26. The XOR circuit 20 receives the comparison result outputs VQP and VQM of the comparator 12. The XOR circuit 20 outputs a first signal, for example, a high-level signal, in accordance with the asserted comparison result, and outputs a second signal, for example, a low-level signal, in accordance with the negated comparison result. The XOR circuit 20 may output a high-level signal when the outputs VQP and VQM have different voltages in accordance with a comparison result of the comparator 12 that has performed a comparison operation. The XOR circuit 20 may output a low-level signal when the comparator 12 is reset and the outputs VQP and VQM have substantially the same voltage.

The delay circuit 21 delays a signal having an edge in accordance with a change in the signal output from the comparator 12, for example, the output of the XOR circuit 20, and feeds back the signal, as a pulse signal $\Phi_c$, to the reset terminal of the comparator 12. The delay circuit 21 delays the output of the XOR circuit 20 to generate a signal Va. The startup circuit 26 generates a pulse signal $\Phi_c$ by logically inverting the signal Va, and the pulse signal $\Phi_c$ is fed back to the reset terminal of the comparator 12. The startup circuit 26 outputs a low-level signal when the signal Va is initially at a low level and when an enable signal EN is at a low level. When the enable signal EN becomes high, the startup circuit 26 outputs the pulse signal Pc generated by logically inverting the signal Va. The operation of the comparator 12 is started when the pulse signal $\Phi_c$ becomes high. The XOR circuit 20 outputs a high-level signal when the outputs VQP and VQM have different voltages in accordance with a comparison result of the comparator 12. The signal Va may become high after delayed by the delay circuit 21. The pulse signal $\Phi_c$ falls in response to a rising edge of the signal Va, the comparator 12 is reset at the falling edge of the pulse signal $\Phi_c$, and the output of the comparator 12 is negated, thereby the outputs VQP and VQM becoming substantially the same potential, for example. In response to the outputs VQP and VQM having substantially the same potential, the XOR circuit 20 outputs a low-level signal, and the signal Va delayed by the delay circuit 21 becomes low. The pulse signal Pc rises in response to a falling edge of the signal Va, and the comparator 12 performs a comparison operation again in response to the rising edge of the pulse signal $\Phi_c$. A change in the signal output from the comparator 12, for example, an edge of the output of the XOR circuit 20, is delayed by the delay circuit 21, and an edge of the pulse signal $\Phi_c$ is generated. The operation timing of the comparator 12 may be controlled by edges of the pulse signal $\Phi_c$.

The edge counting & delay amount adjustment circuit 23 counts the number of edges of a signal generated in a feedback loop including the delay circuit 21 during a period generated by integer-multiplying the cycle of an external clock signal CLK. The integer multiple may be any multiple of the cycle length. The edge counting period generation circuit 22 generates a pulse signal $\Phi_t$ indicating an integer-multiple period based on the external clock signal CLK. The edge counting & delay amount adjustment circuit 23 adjusts the amount of delay of the delay circuit 21 in accordance with the count value. For example, the edge counting & delay amount adjustment circuit 23 increases the amount of delay of the delay circuit 21 when the edge count value is greater than or equal to a certain value, and reduces the amount of delay of the delay circuit 21 when the edge count value is smaller than the certain value. The edge counting & delay amount adjustment circuit 23 supplies a count value N that increases with the count of edges to the logic circuit 24.

The logic circuit 24 generates a pulse signal $\Phi_n$ based on the count value N. The pulse signal $\Phi_n$ may be, for example, 0 when the count value N is smaller than a predetermined certain value, and may be, for example, 1 when the count value N is greater than or equal to the predetermined value. For example, the rising edges of the pulse signal $\Phi_n$ represent the timing at which a certain number of edges of a signal are generated in the feedback loop, and the pulse signal $\Phi_n$ may be supplied to the $\Phi_s$ generation circuit 25. The $\Phi_s$ generation circuit 25 generates a sampling clock $\Phi_s$ based on the pulse signal $\Phi_n$ and the external clock signal CLK. For example, the $\Phi_s$ generation circuit 25 generates a sampling clock $\Phi_s$ based on the timing of the rising edges of the pulse signal $\Phi_n$, for example, the timing at which a certain number of edges of a signal are generated in the feedback loop, and based on the edge timing of the external clock signal CLK.

Figure 3:
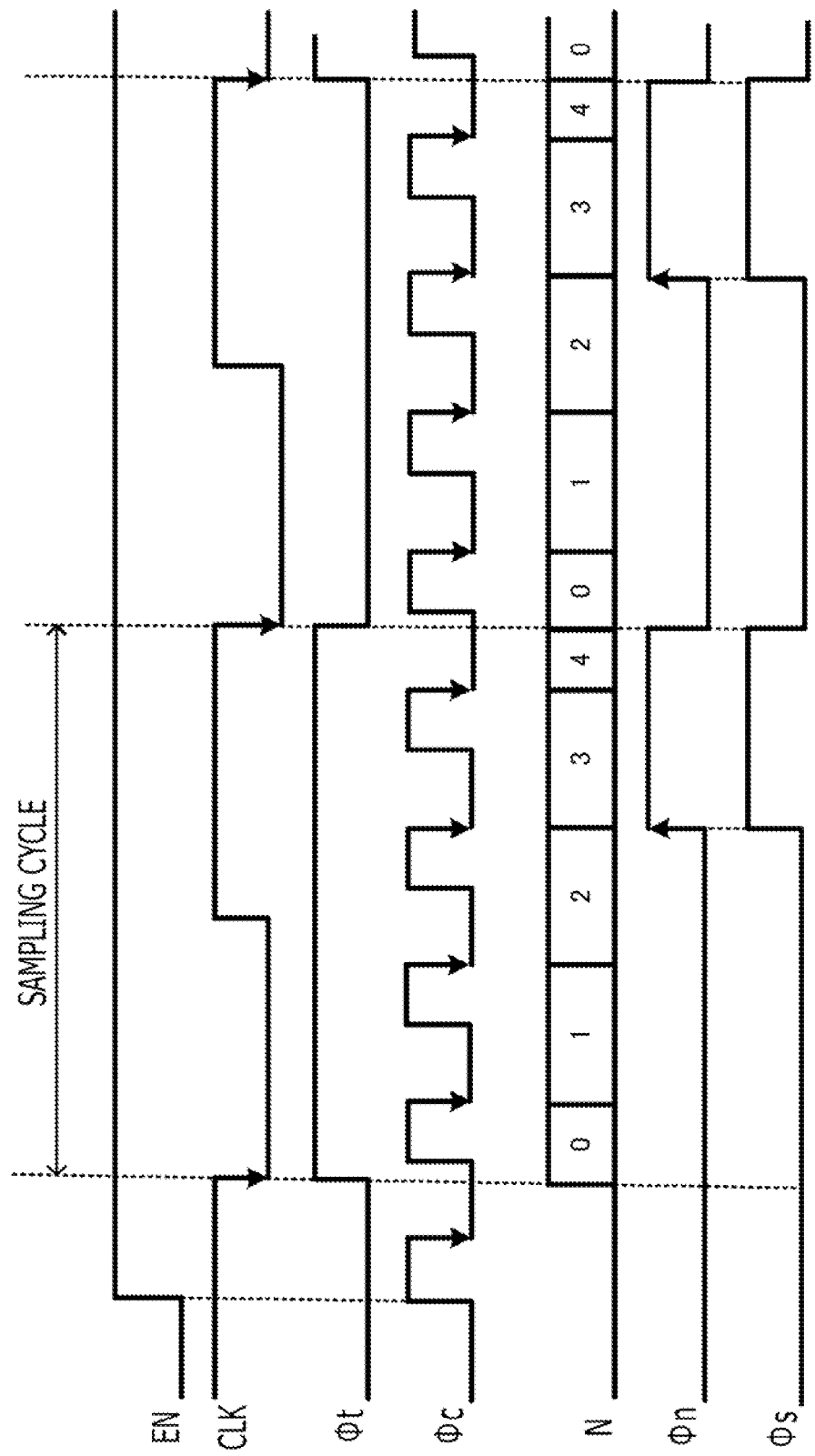
FIG. 3 illustrates an exemplary operation of a successive approximation register AD converter and an asynchronous clock generation circuit.

FIG. 3 illustrates an exemplary operation of a successive approximation register AD converter and an asynchronous clock generation circuit. The successive approximation register AD converter operations illustrated in FIG. 3 may be performed by the successive approximation register AD converter 10 illustrated in FIG. 1, and the operations of the asynchronous clock generation circuit illustrated in FIG. 3 may be performed by the asynchronous clock generation circuit 14 illustrated in FIG. 2. An edge counting period may be one cycle of the external clock signal CLK. The pulse signal $\Phi_t$ generated by the edge counting period generation circuit 22 may be at a high level during a period from a certain falling edge of the clock signal CLK to the next falling edge. When the enable signal EN transitions to a high level, the pulse signal $\Phi_c$ rises in response to the change of the enable signal EN to a high level. With the feedback loop including the delay circuit 21, the comparison operation performed by the comparator 12 and the operation of resetting the comparator 12 are repeatedly performed. The pulse signal $\Phi_c$ may be a signal having pulses at certain intervals illustrated in FIG. 3. The edge counting & delay amount adjustment circuit 23 counts the number of edges of the pulse signal $\Phi_c$, for example, the output signal Va of the delay circuit 21 in FIG. 2, and obtains the count value N. The pulse signal $\Phi_c$ may be the output signal Va of the delay circuit 21 illustrated in FIG. 2.

The pulse signal $\Phi_n$ illustrated in FIG. 3 may be at a low level when the count value N is smaller than 3, and may be at a high level when the count value N is greater than or equal to 3. The sampling clock $\Phi_s$ rises to a high level in response to a rising edge of the pulse signal $\Phi_n$. The count value N obtained by the edge counting & delay amount adjustment circuit 23 may be, for example, 4 during an edge counting period during which the pulse signal $\Phi_t$ is at a high level. The edge counting & delay amount adjustment circuit 23 adjusts the amount of delay of the delay circuit 21 so that the count value becomes a certain value, for example, 4. When the edge counting period is completed, the count value N measured by the edge counting & delay amount adjustment circuit 23 may be reset to 0. The pulse signal $\Phi_n$ changes to a low level in response to a reset of the count value N to 0. For example, the successive approximation register AD converter 10 may perform a successive comparison three times to determine a digital code of a sampled input voltage. The number of bits of the digital code may be 3. In one sampling cycle, for example, in one cycle of the external clock signal CLK, a period during which the pulse signal $\Phi_c$ becomes high at least three times may be set as a comparison period, and a certain sampling period for sampling the input voltage may be set. The edge counting & delay amount adjustment circuit 23 may adjust the amount of delay of the delay circuit 21 so that the count value during the edge counting period, for example, 4, becomes substantially equal to the sum of the number of bits of the digital code, for example, 3, and a predetermined value, for example, 1. Thus, the number of times of a successive comparison for determining a digital code of the input voltage may be set to 3, and a sampling period equal to approximately one cycle of the pulse signal $\Phi_c$ may be set. The predetermined value may be set when the number of pulses of the pulse signal $\Phi_c$ corresponding to the time of the sampling operation is set by taking into account the amount of delay of the delay circuit 21, the delay for the comparator 12, or any other appropriate factor.

The pulse signal $\Phi_n$ may be changed to low substantially at the same time as a falling edge of the external clock signal CLK. Since the pulse signal $\Phi_n$ is changed to low by resetting a counter in the edge counting & delay amount adjustment circuit 23 in response to a falling edge of the pulse signal $\Phi_t$, the pulse signal $\Phi_n$ may be changed to low later than a falling edge of the external clock signal CLK. Therefore, the pulse signal $\Phi_n$ may not be used as the sampling clock $\Phi_s$, or falling edges of the sampling clock $\Phi_s$ may not be set by falling edges of the pulse signal $\Phi_n$. In the successive approximation register AD converter 10 illustrated in FIG. 1, the DAC 11 samples the input voltage during a period during which the sampling clock $\Phi_s$ is at a high level, and a sampling value is defined in accordance with a falling edge of the sampling clock $\Phi_s$. In a system including the successive approximation register AD converter 10, the successive approximation register AD converter 10 is controlled by the external clock signal CLK. Thus, the timing of sampling may also be controlled by the external clock signal CLK. Therefore, in the successive approximation register AD converter 10 illustrated in FIG. 1 in which the sampling clock $\Phi_s$ is generated, falling edges of the sampling clock $\Phi_s$ with which sampling values are defined may be synchronous with the external clock signal CLK. The $\Phi_s$ generation circuit 25 illustrated in FIG. 2 may generate falling edges of the sampling clock $\Phi_s$ in synchronization with falling edges of the external clock signal CLK.

The successive approximation register AD converter 10 illustrated in FIG. 1 adjusts an oscillation cycle of the pulse signal $\Phi_c$ based on the cycle of the external clock signal CLK, and generates a sampling clock $\Phi_s$. When the sampling frequency of the successive approximation register AD converter 10 is high, the length of the sampling period may be shorter than the comparison period, and the duty ratio of the sampling clock $\Phi_s$ may become small. A circuit that stably generates a clock signal having a small duty ratio and a high speed may have a complex configuration. Therefore, in a system which supplies a sampling clock $\Phi_s$ generated externally to the successive approximation register AD converter 10, the circuit area or power consumption may increase. The successive approximation register AD converter 10 illustrated in FIG. 1 generates therein a sampling clock $\Phi_s$ for setting the timing of sampling in accordance with a period during which a comparison operation is performed. Thus, the desired sampling clock may be efficiently generated. The circuit that generates a sampling clock $\Phi_s$ may be a simple digital circuit with a small circuit area or low power consumption.

Figure 4:
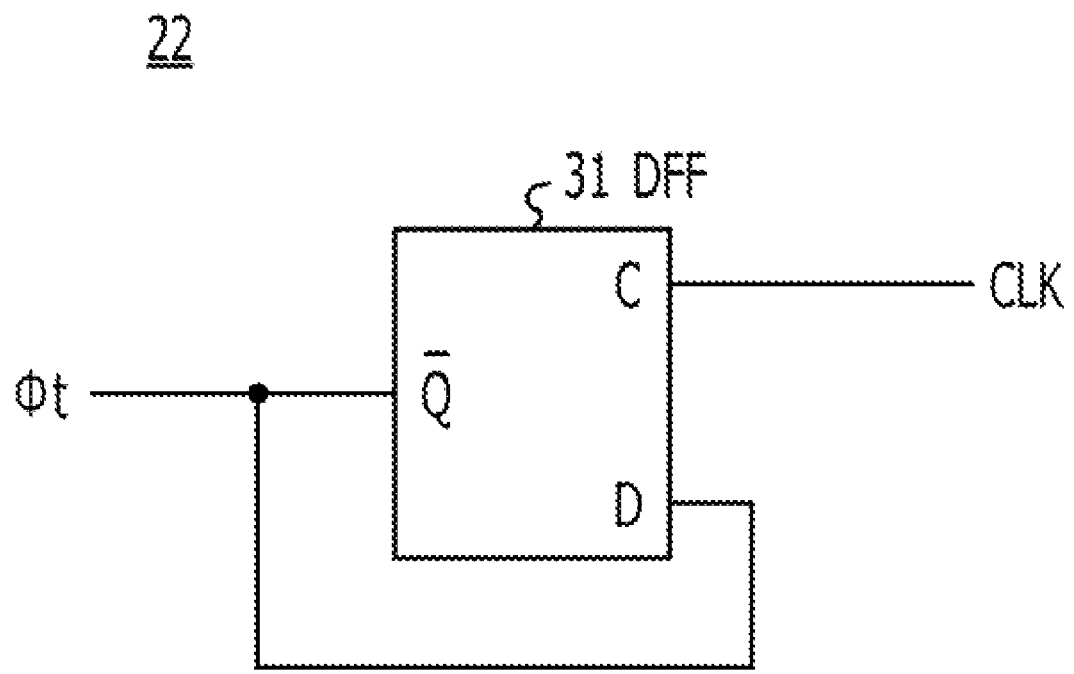
FIG. 4 illustrates an exemplary edge counting period generation circuit.

FIG. 4 illustrates an exemplary edge counting period generation circuit. An edge counting period generation circuit 22 illustrated in FIG. 4 generates a signal indicating an edge counting period that is the cycle length of the external clock signal CLK. The edge counting period generation circuit 22 includes a delay flip-flop (DFF) 31. The external clock signal CLK is coupled to a clock input C of the delay flip-flop 31, and an inverted output/Q of the delay flip-flop 31 is coupled to a data input D. When a certain edge of the external clock signal CLK, for example, a falling edge illustrated in FIG. 3, is input, the delay flip-flop 31 captures an inverted value as a data input, thereby outputting an inverted output. Therefore, the output signal of the delay flip-flop 31 may be a signal obtained by dividing the frequency of the external clock signal CLK by ½.

Figure 5:
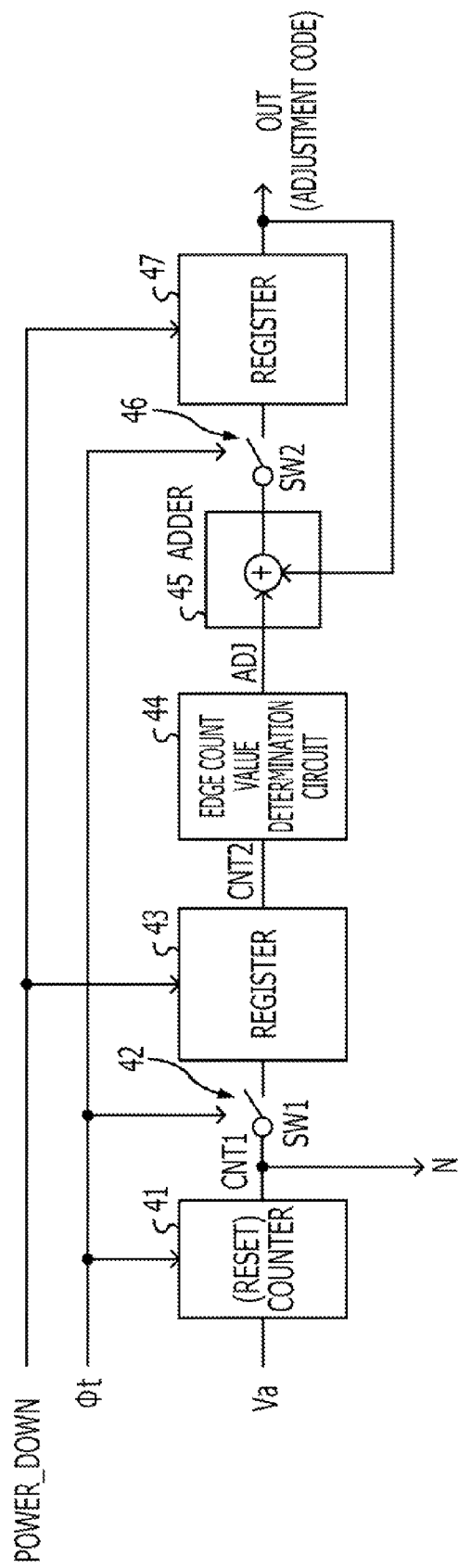
FIG. 5 illustrates an exemplary edge counting & delay amount adjustment circuit.

FIG. 5 illustrates an exemplary edge counting & delay amount adjustment circuit. An edge counting period may be the cycle of the external clock signal CLK. An edge counting & delay amount adjustment circuit 23 illustrated in FIG. 5 includes a counter 41, a switch 42, a register 43, an edge count value determination circuit 44, an adder 45, a switch 46, and a register 47. The counter 41 counts in response to a rising edge of the signal Va, for example, in response to a falling edge of the pulse signal $\Phi_c$. In response to any edge of the pulse signal Pt representing a counting period, for example, both a rising edge and a falling edge of the pulse signal Pt, the counter 41 may be reset and a count value CNT1 (count value N) may be initialized to 0. The switch 42 is turned on when the pulse signal $\Phi_t$ is at a high level, and the edge count value, for example, the count value CNT1 of the counter 41, is stored in the register 43. The switch 42 is turned off when the pulse signal $\Phi_t$ is at a low level. After the edge counting period, for example, during a cycle immediately after the edge counting period, the register 43 holds the edge count value of the previous edge counting period. An initial value is set in the registers 43 and 47 based on a power_down signal at the beginning of the operation. The edge count value determination circuit 44 determines whether or not the counter value CNT2 of a counter stored in the register 43 is equal to a certain value. When the counter value CNT2 is equal to the certain value, the edge count value determination circuit 44 sets an output ADJ to zero. When the counter value CNT2 is greater than the certain value, the edge count value determination circuit 44 sets the output ADJ to +1. When the counter value CNT2 is less than the certain value, the edge count value determination circuit 44 sets the output ADJ to −1. The adder 45 adds together the current adjustment code OUT stored in the register 47 and the output ADJ of the edge count value determination circuit 44, and outputs the result to the register 47 via the switch 46. The switch 46 is turned on when the pulse signal Pt is at a low level, and the value of the register 47 is updated during the cycle next to the edge counting period. The adjustment code OUT to be supplied to the delay circuit 21 is changed in accordance with the determination result of the edge count value determination circuit 44, and the amount of delay of the delay circuit 21 is adjusted.

Figure 6:
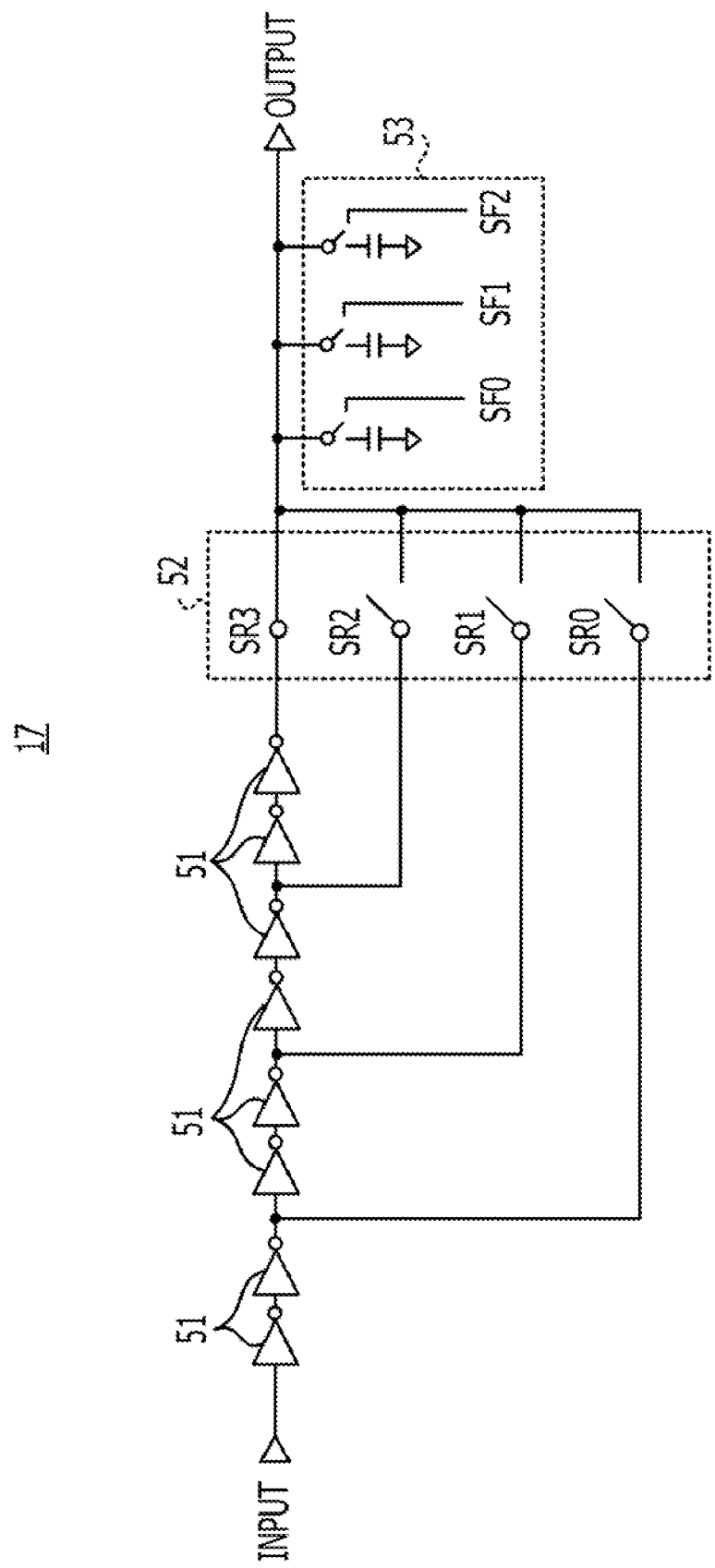
FIG. 6 illustrates an exemplary delay circuit.

FIG. 6 illustrates an exemplary delay circuit. A delay circuit 21 illustrated in FIG. 6 includes a plurality of delay elements 51 coupled in series, for example, inverters, a selection circuit 52, and a capacitor addition circuit 53. The selection circuit 52 includes a plurality of switches. The selection circuit 52 asserts one of selection signals SR0 to SR3, and turns on the corresponding one of the switches. The selection signals SR0 to SR3 may correspond to, for example, signals obtained by decoding the output adjustment code OUT in the register 47 of the edge counting & delay amount adjustment circuit 23 illustrated in FIG. 5. The selection circuit 52 selects a delay element among the plurality of delay elements 51 in accordance with the output of the edge counting & delay amount adjustment circuit 23, thereby coarsely adjusting the amount of delay. The capacitor addition circuit 53 includes a plurality of capacitors and switches. The capacitor addition circuit 53 asserts a combination of selection signals SF0 to SF2, and couples one or a plurality of capacitors to a signal line via a switch or switches. The selection signals SF0 to SF2 may correspond to, for example, the lower bits of the output adjustment code OUT in the register 47 of the edge counting & delay amount adjustment circuit 23 illustrated in FIG. 5. A capacitance value corresponding to the output of the edge counting & delay amount adjustment circuit 23 is coupled to the signal line as a load, and the amount of delay may be finely adjusted.

Figure 7:
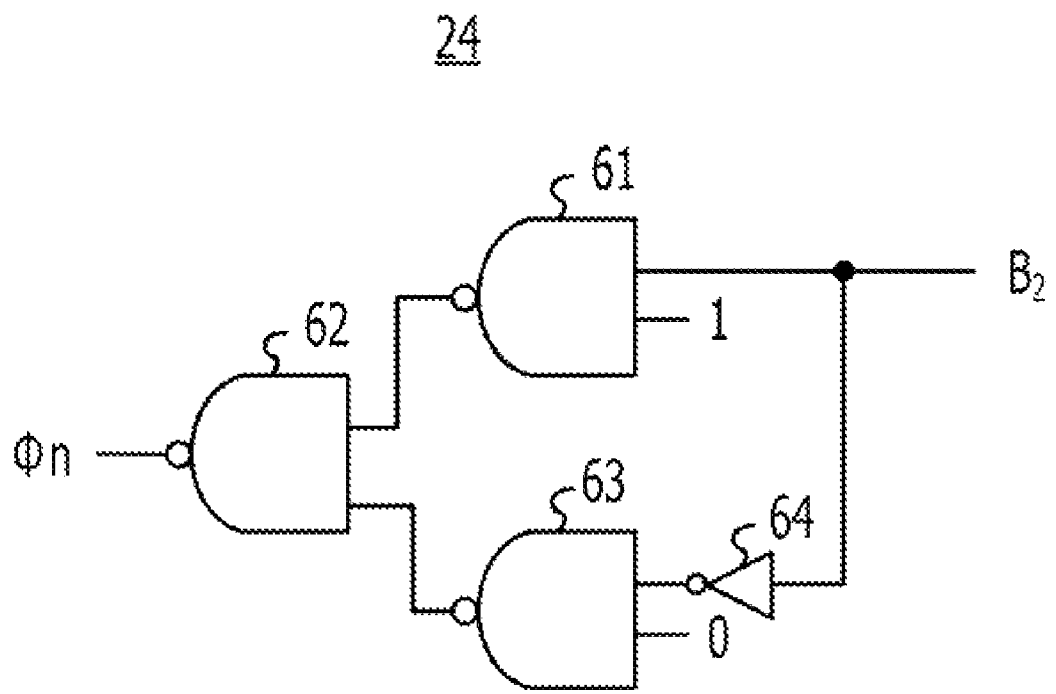
FIG. 7 illustrates an exemplary logic circuit.

FIG. 7 illustrates an exemplary logic circuit. For example, the logic circuit 24 may output a low-level signal when the count value N is smaller than 4, and may output a high-level signal when the count value N is greater than or equal to 4. The logic circuit 24 includes NAND circuits 61 to 63 and an inverter 64. An input $B_2$ may be the third bit ($N=B_2 \times 2^2 + B_1 \times 2^1 + B_0 \times 2^0$) of the binary representation when the maximum value of the count value N is 7. When the input $B_2$ is at a high level, 1 may be output, and when the input $B_2$ is at a low level, 0 may be output.

Figure 8:
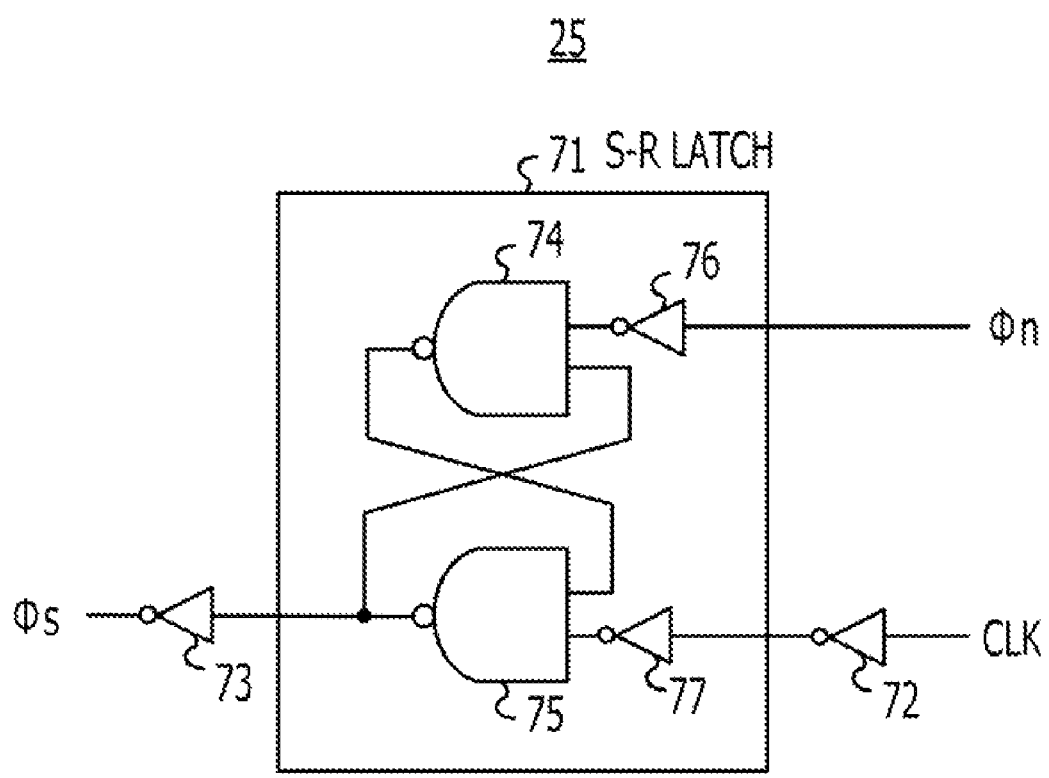
FIG. 8 illustrates an exemplary $\Phi_s$ generation circuit.

FIG. 8 illustrates an exemplary $\Phi_s$ generation circuit. The $\Phi_s$ generation circuit 25 includes an S-R (set-reset) latch 71, an inverter 72, and an inverter 73. The S-R latch 71 includes NAND circuits 74 and 75 and inverters 76 and 77. When a certain sampling cycle begins, the external clock signal CLK may be at a low level, the pulse signal $\Phi_n$ may be at a low level, and the sampling clock $\Phi_s$ generated by inverting the latch output using the inverter 73 becomes low. Even if the external clock signal CLK goes high, the sampling clock $\Phi_s$ may stay unchanged. When the pulse signal $\Phi_n$ is changed to high, the sampling clock $\Phi_s$ becomes high. When the sampling cycle is completed and when the external clock signal CLK is changed to low, the sampling clock $\Phi_s$ is changed to low in response to a falling edge of the external clock signal CLK. Rising edges of the sampling clock $\Phi_s$ may be synchronous with rising edges of the pulse signal $\Phi_n$, and falling edges of the sampling clock $\Phi_s$ may be synchronous with falling edges of the external clock signal CLK.

The edge counting period may be one cycle of the external clock signal CLK or an integer multiple of the cycle of the external clock signal CLK. For example, when the pulse signal Pt defines the edge counting period, a cycle signal that is at a high level during a period of two cycles of the external clock signal CLK may be used. The count value CNT1 used by the edge counting & delay amount adjustment circuit 23 to adjust the amount of delay of the delay circuit 21 and the count value N supplied from the edge counting & delay amount adjustment circuit 23 to the logic circuit 24 may be independent from each other. For example, two counters 41 may be provided in the circuit illustrated in FIG. 5. One counter is reset based on a falling edge of the clock signal CLK, and the output of the counter is supplied to the logic circuit 24 as the count value N. The other counter is reset based on a rising edge of the pulse signal $\Phi_t$, and the output of the other counter is supplied as a count value CNT1 to the register 43 via the switch 42. An expected value of the count value CNT1 during a period of two cycles may correspond to twice the expected value during a period of one cycle.

Figure 9:
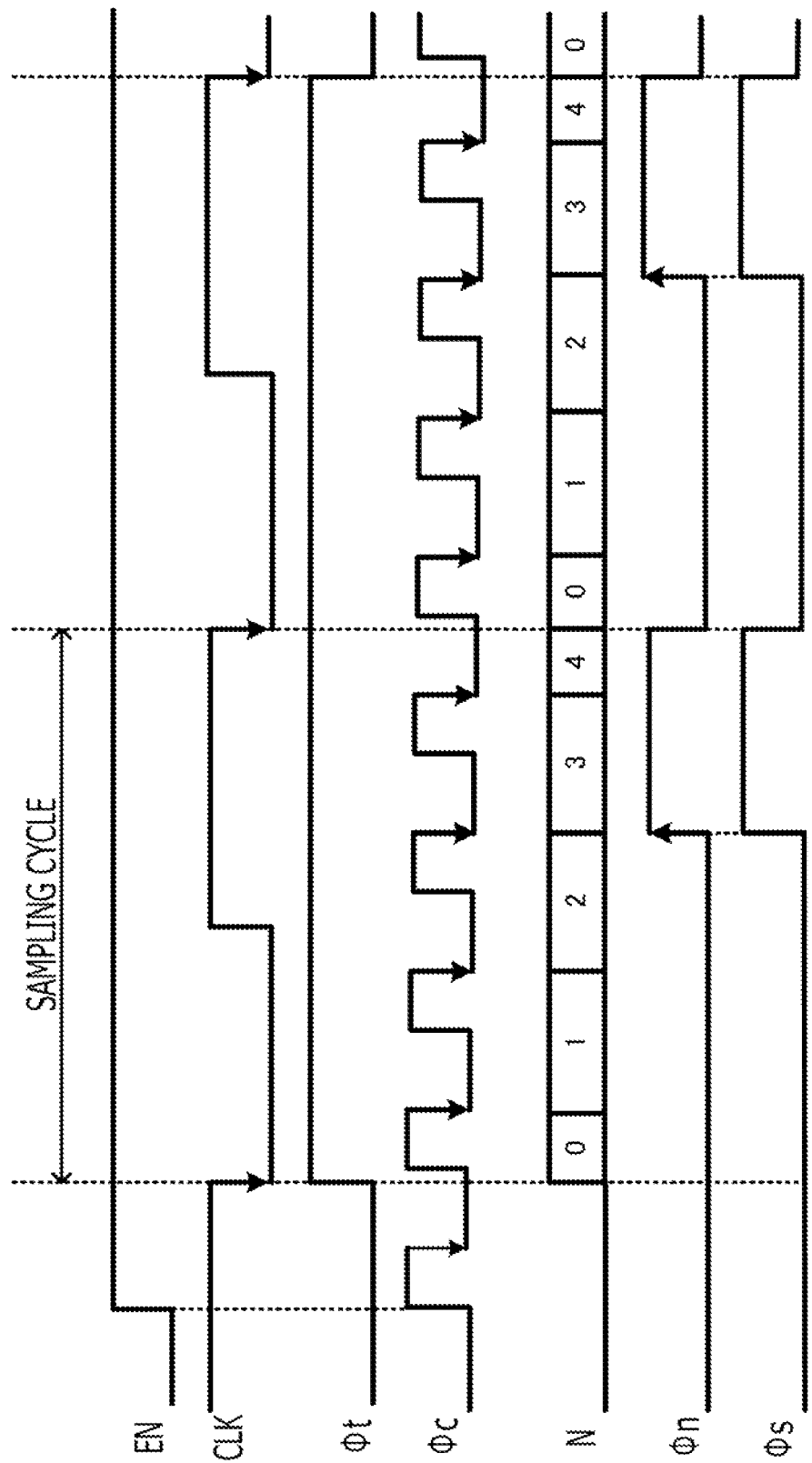
FIG. 9 illustrates an exemplary operation of a successive approximation register AD converter and an asynchronous clock generation circuit.

FIG. 9 illustrates an exemplary operation of a successive approximation register AD converter and an asynchronous clock generation circuit. The successive approximation register AD converter and asynchronous clock generation circuit operations illustrated in FIG. 9 may correspond to operations performed by the successive approximation register AD converter 10 illustrated in FIG. 1 and operations performed by the asynchronous clock generation circuit 14 illustrated in FIG. 2, respectively. An edge counting period may be equal to two cycles of the external clock signal CLK. The pulse signal $\Phi_t$ generated by the edge counting period generation circuit 22 may be at a high level during the period from a falling edge of the clock signal CLK to the second falling edge following that falling edge. When the enable signal EN transitions to high, the pulse signal $\Phi_c$ rises in response to the change of the enable signal EN to high. With the feedback loop including the delay circuit 21, the comparison operation performed by the comparator 12 and the operation of resetting the comparator 12 are repeatedly performed. Thus, the pulse signal $\Phi_c$ may correspond to a signal whose pulses are generated at certain intervals illustrated in FIG. 9. The edge counting & delay amount adjustment circuit 23 counts the number of edges of the pulse signal $\Phi_c$, for example, the number of edges of the output signal Va of the delay circuit 21 illustrated in FIG. 2, and outputs a count value N. The count value N may be reset to an initial value of 0 in response to a falling edge of the external clock signal CLK. The amount of delay of the delay circuit 21 may be adjusted so that the count value obtained by counting the number of edges of the pulse signal $\Phi_c$ or the output signal Va (see FIG. 2) during a period when the pulse signal $\Phi_t$ is at a high level becomes equal to a certain value, for example, 8 as illustrated in FIG. 9.

The successive approximation register AD converter 10 including the asynchronous clock generation circuit 14 illustrated in FIG. 2 may continuously oscillate the pulse signal $\Phi_c$ in the manner as illustrated in, for example, FIG. 3 or 9. For example, the pulse signal $\Phi_c$ may be continuously oscillated during a sampling period ($\Phi_s$=high level) and a comparison period ($\Phi_s$=low level). The timing at which the sampling cycle begins, for example, the timing of a falling edge of the external clock signal CLK, and the timing of a rising edge of the pulse signal $\Phi_c$ may be independent from each other. The time from the end of a sampling period to the start of the initial comparison operation may be arbitrarily set.

Figure 10:
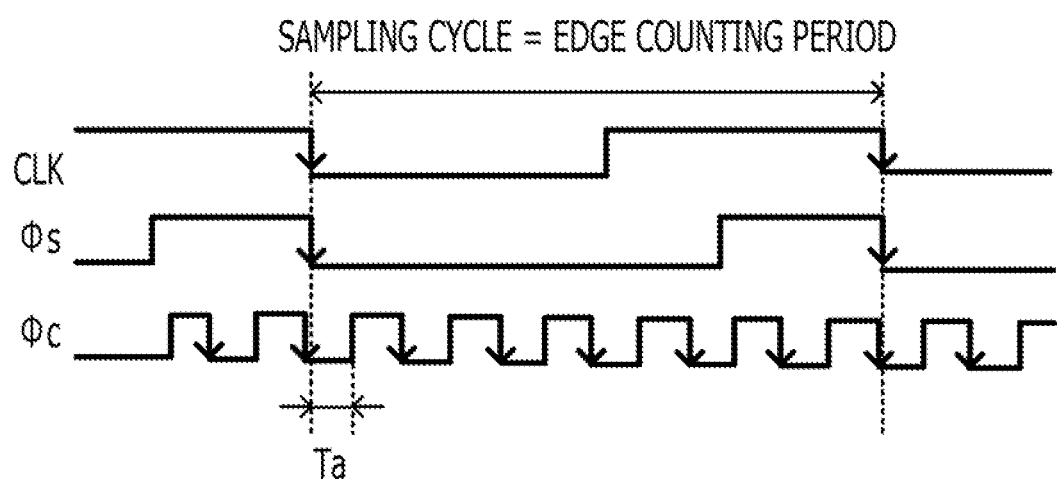
FIG. 10 illustrates an exemplary time from an end of a sampling period to a start of comparison.
Figure 11:
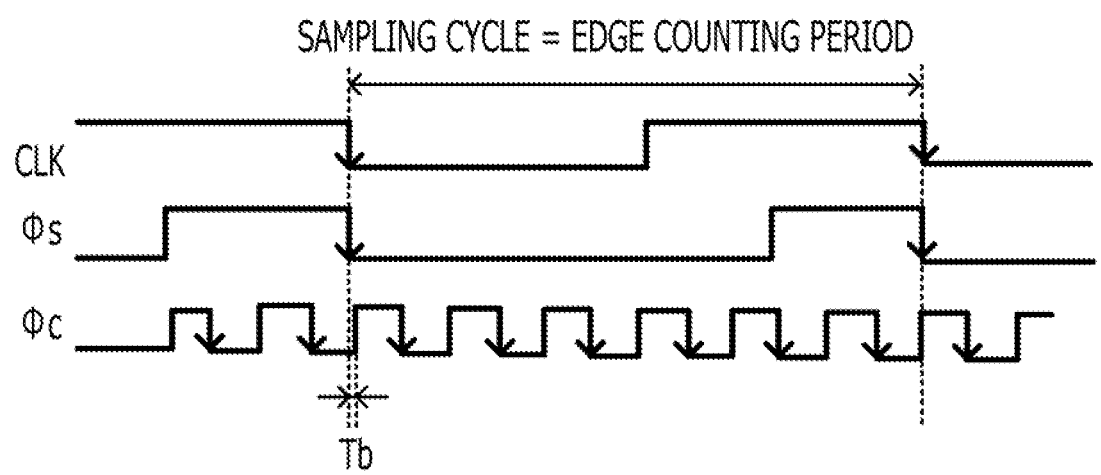
FIG. 11 illustrates an exemplary time from an end of a sampling period to a start of comparison.

FIGS. 10 and 11 illustrate an exemplary time from an end of a sampling period to a start of comparison. In FIG. 10, Ta represents a time from the end of a sampling period ($\Phi_s$=high level) to the start of comparison (first high-level pulse of $\Phi_c$). The time Ta may be a sufficient time. For example, during the time Ta, when the capacitors of the DAC 11 illustrated in FIG. 1 are switched from the sampling operation to the comparison operation, the comparator 12 may start comparison at the timing at which $\Phi_c$ becomes high. In FIG. 11, Tb represents a time from the end of a sampling period ($\Phi_s$=high level) to the start of comparison (first high-level pulse of $\Phi_c$). The time Tb may be short and may not be a sufficient time interval. During a time, for example, during the time Tb, when the capacitors of the DAC 11 illustrated in FIG. 1 are switched from the sampling operation to the comparison operation, the comparator 12 may not start comparison at desired timing at which $\Phi_c$ becomes high. The time from the end of a sampling period to the start of comparison may be set.

Figure 12:
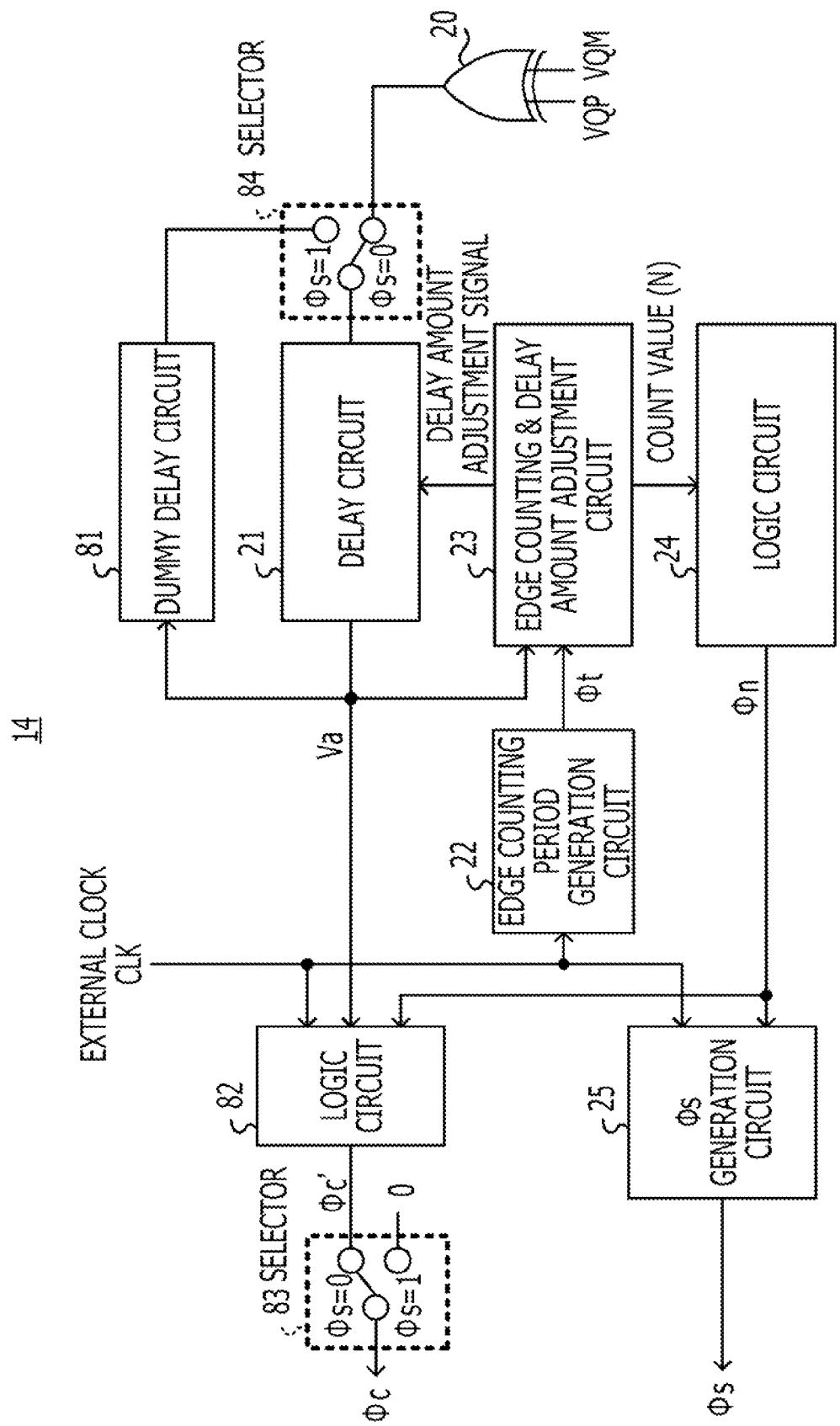
FIG. 12 illustrates an exemplary asynchronous clock generation circuit.

FIG. 12 illustrates an exemplary asynchronous clock generation circuit. In FIG. 12, elements substantially the same as or similar to the elements illustrated in FIG. 2 are assigned the same numbers, and a description thereof may be omitted or reduced. An asynchronous clock generation circuit 14 illustrated in FIG. 12 includes an XOR circuit 20, a delay circuit 21, an edge counting period generation circuit 22, an edge counting & delay amount adjustment circuit 23, a logic circuit 24, a $\Phi_s$ generation circuit 25, a dummy delay circuit 81, a logic circuit 82, and selectors 83 and 84.

When the selectors 83 and 84 are coupled in accordance with $\Phi_s$=0, a signal delayed by the delay circuit 21, for example, a signal having edges based on changes in the output of the comparator 12 illustrated in FIG. 1, is fed back to the reset terminal of the comparator 12. Thus, a first loop is formed. When the selectors 83 and 84 are coupled in accordance with $\Phi_s$=1, the output Va of the delay circuit 21 is supplied to the delay circuit 21 via the delay of the dummy delay circuit 81. Thus, a second loop is formed. When a change from $\Phi_s=0$ to $\Phi_s=1$ occurs during one cycle of the external clock signal CLK, the feedback loop including the delay circuit 21 is switched from the first loop to the second loop during one cycle of the external clock signal CLK. When the delay circuit 21 is included in the second loop, the delay circuit 21 is separated from the first loop, and the comparator 12 may be stopped. The logic circuit 82 generates a pulse signal $\Phi_c'$ based on the external clock signal CLK, the pulse signal $\Phi_n$, and the output signal Va of the delay circuit 21. The selector 83 selects at least one of the pulse signal $\Phi_c'$ and 0 in accordance with $\Phi_s$, and supplies the selected pulse signal $\Phi_c'$ or 0 to the reset terminal of the comparator 12 as the pulse signal $\Phi_c$. The operation of the logic circuit 24 illustrated in FIG. 12 may be substantially the same as or similar to the operation of the logic circuit 24 illustrated in FIG. 2.

Figure 13:
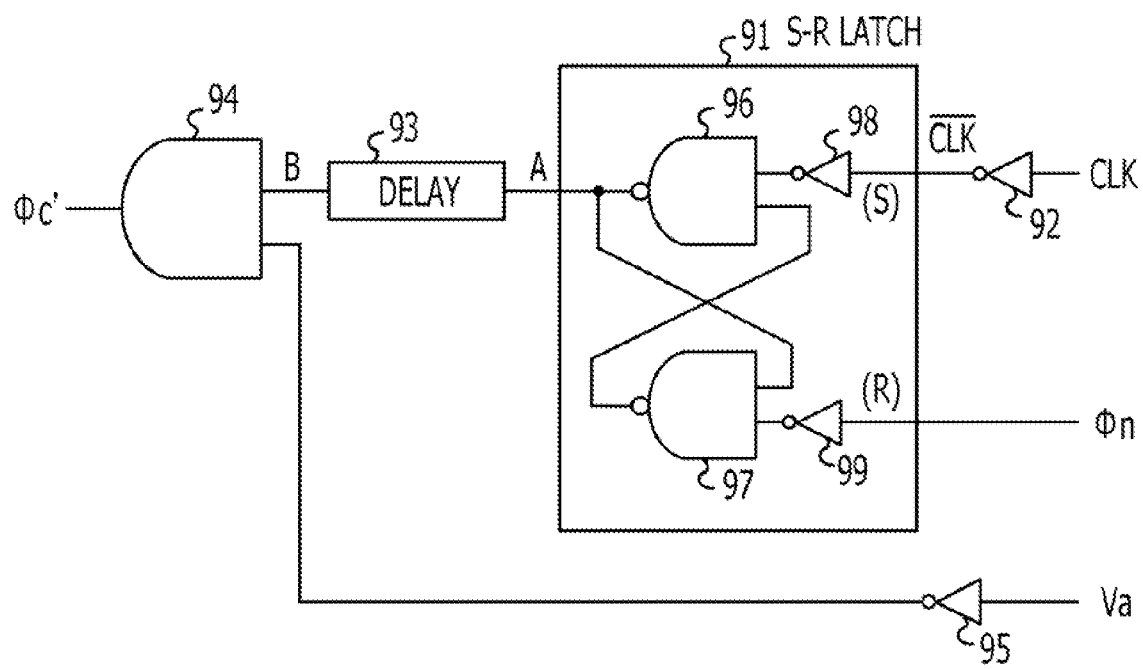
FIG. 13 illustrates an exemplary logic circuit.

FIG. 13 illustrates an exemplary logic circuit. The logic circuit 82 includes an S-R (set-reset) latch 91, an inverter 92, a delay element 93, an AND circuit 94, and an inverter 95. The S-R latch 91 includes NAND circuits 96 and 97 and inverters 98 and 99.

Figure 14:
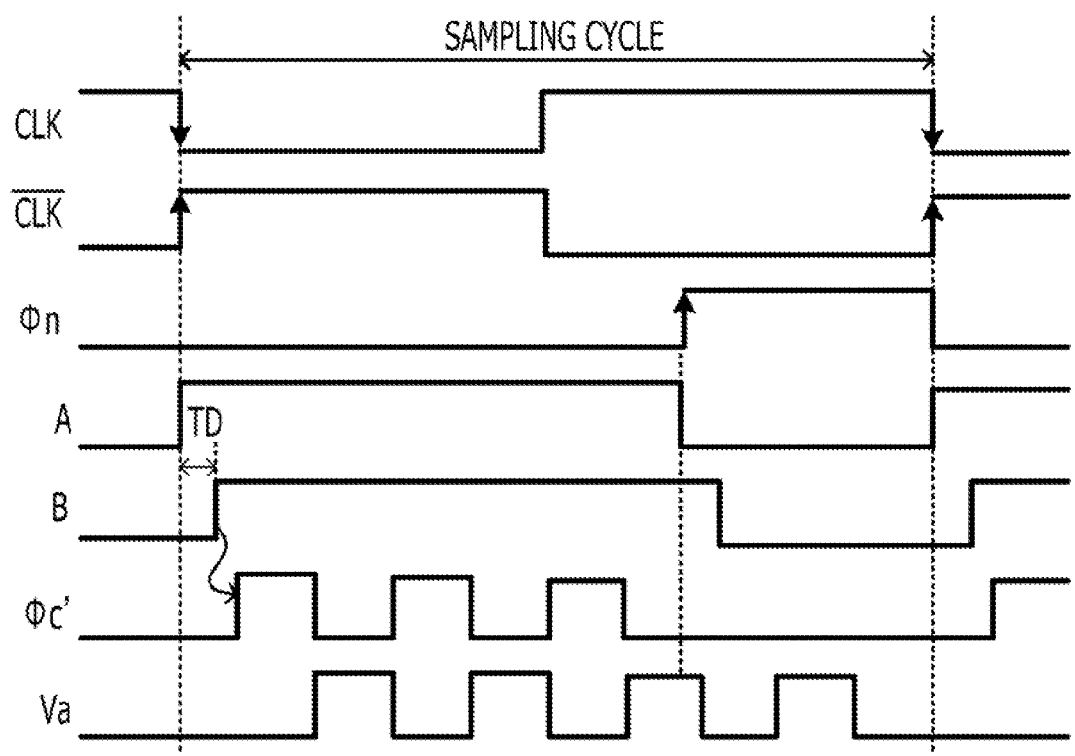
FIG. 14 illustrates an exemplary operation of the logic circuit.

FIG. 14 illustrates an exemplary operation of a logic circuit. The logic circuit 82 illustrated in FIG. 13 may perform the operation illustrated in FIG. 14. At the beginning of a sampling cycle, the external clock signal CLK may be at a low level and the pulse signal $\Phi_n$ may be at a low level. Further, a signal A that is the latch output may be at a high level. Even if the external clock signal CLK becomes high, the signal A may not be changed. When the pulse signal $\Phi_n$ is changed to high, the signal A may become low. When the sampling cycle is completed and when the external clock signal CLK is changed to low, the signal A is changed to high in response to a falling edge of the external clock signal CLK. The delay element 93 delays the signal A by an amount corresponding to a delay time TD to generate a signal B. Since the signal Va is at a low level at the beginning of the sampling cycle, the output of the inverter 95 is at a high level. A rising edge of the signal B is output as a rising edge of the pulse signal $\Phi_c'$ through the AND circuit 94. When, for example, the comparator 12 illustrated in FIG. 1 performs a comparison operation based on the rising edge of the pulse signal $\Phi_c'$, the output of the XOR circuit 20 illustrated in FIG. 12 is changed to high, and the signal Va delayed by the delay circuit 21 is changed to high. Since the signal B is at a high level, the pulse signal $\Phi_c'$ is changed to low in accordance with the change of the signal Va to high. When, for example, the comparator 12 illustrated in FIG. 1 stops the comparison operation in response to the falling edge of the pulse signal $\Phi_c'$, the output of the XOR circuit 20 illustrated in FIG. 12 is changed to low, and the signal Va delayed by the delay circuit 21 is changed to low. Since the signal B is at a high level, the pulse signal $\Phi_c'$ may be changed to high again in accordance with the change of the signal Va to low. Likewise, a series of pulse signals $\Phi_c'$ is generated during a period during which the signal B is at a high level.

During a comparison period during which $\Phi_s=0$, the number of edges of the signal Va oscillated by the first loop including the delay circuit 21 and the comparator 12 (see FIG. 1) is counted. During a sampling period where $\Phi_s=1$, the number of edges of the signal Va oscillated by the second loop including the delay circuit 21 and the dummy delay circuit 81 is counted. The amount of delay of the delay circuit 21 may be adjusted so that the count value during the counting period, for example, during one cycle of the external clock signal CLK, becomes equal to the sum of the number of bits of the digital code and a certain value. The number of times successive comparison for setting a digital code of the input voltage is set, and the sampling period corresponding to the length measured based on the oscillation cycle of the signal Va oscillated by the second loop is set. The amount of delay of the dummy delay circuit 81 may be set so that the oscillation cycle of the second loop becomes substantially equal to the oscillation cycle of the first loop. The certain value may be set to a certain number of oscillation cycles of the signal Va oscillated by the second loop corresponding to the sampling operation period.

In the asynchronous clock generation circuit 14 illustrated in FIG. 12, the comparator 12 may stop during a sampling period during which $\Phi_s=1$. At the beginning of a comparison period during which $\Phi_s=0$, for example, at a falling edge of the external clock signal CLK, the signal Va of the first loop may be set to the initial state, for example, to a low level. The pulse signal $\Phi_c'$ may rise at the timing at which the falling edge of the external clock signal CLK is delayed by the delay element 93 by the amount corresponding to the delay time TD. The time interval from the end of a sampling period to the start of the initial comparison operation may be set to the desired length. When the second loop is switched to the first loop and the output of the dummy delay circuit 81 is at a high level, the signal Va may become high for a short period of time in the first loop after switching. When the delay time TD is set to a sufficient length, the signal Va may be returned to the initial value, for example, a low level, during a period during which the signal B is at a low level.

Figure 15:
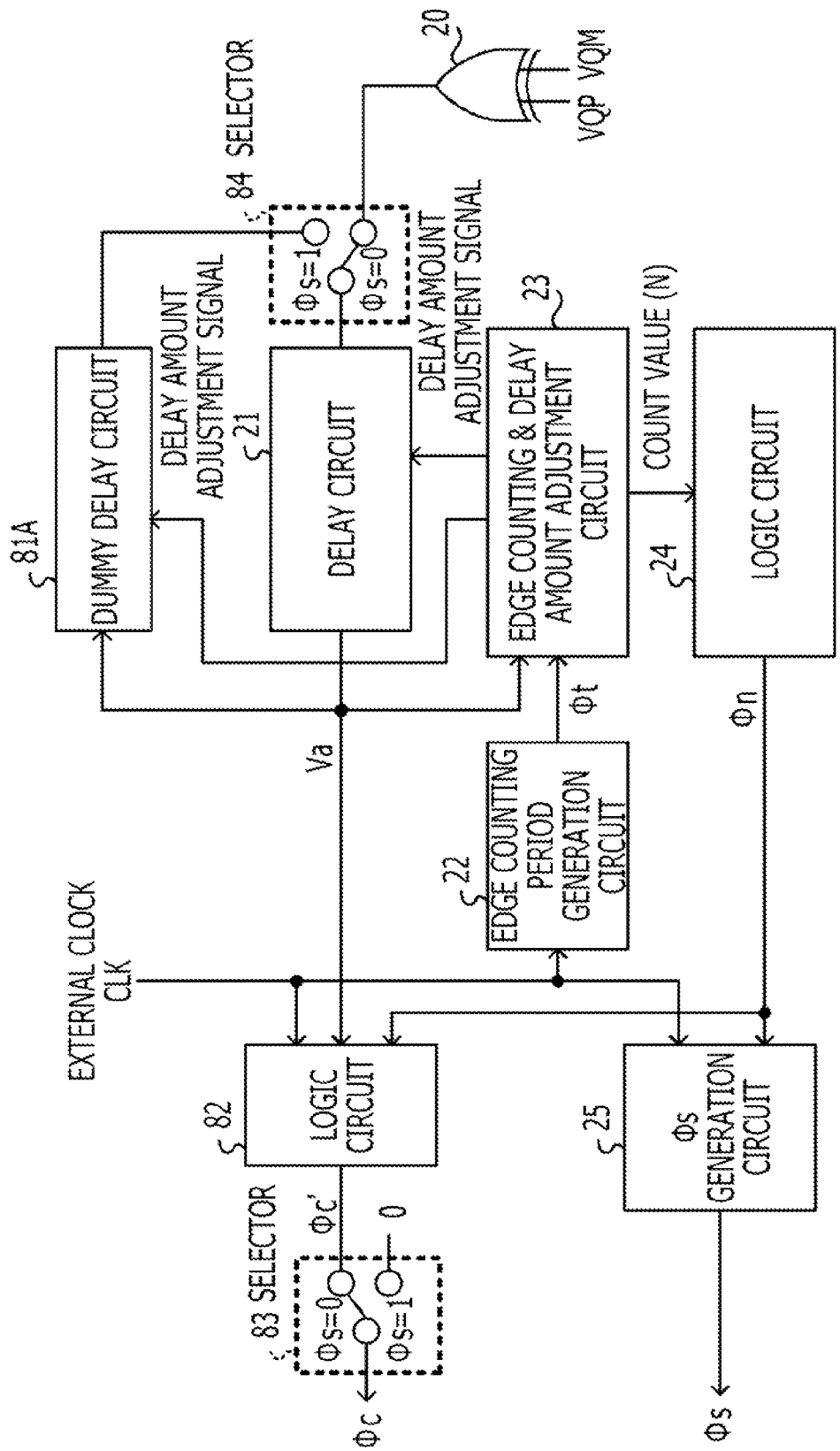
FIG. 15 illustrates an exemplary asynchronous clock generation circuit.

FIG. 15 illustrates an exemplary asynchronous clock generation circuit. In FIG. 15, elements substantially the same as or similar to the elements illustrated in FIG. 12 are assigned the same numerals, and a description thereof may be omitted or reduced. An asynchronous clock generation circuit 14 illustrated in FIG. 15 may include a dummy delay circuit 81A in place of the dummy delay circuit 81 illustrated in FIG. 12. While the dummy delay circuit 81 includes a certain delay, the amount of delay of the dummy delay circuit 81A illustrated in FIG. 15 may be adjusted in accordance with a delay amount adjustment signal from the edge counting & delay amount adjustment circuit 23.

The edge counting & delay amount adjustment circuit 23 may adjust the amount of delay of the delay circuit 21 and the amount of delay of the dummy delay circuit 81A. The adjustment of the amount of delay of the dummy delay circuit 81A may be controlled in substantially the same manner as or similar manner to the adjustment of the amount of delay of the delay circuit 21. When the amount of delay of the delay circuit 21 increases, the amount of delay of the dummy delay circuit 81A increases, and when the amount of delay of the delay circuit 21 decreases, the amount of delay of the dummy delay circuit 81A decreases. Therefore, an oscillation cycle in the second loop may be set to be substantially the same as or similar to an oscillation cycle in the first loop.

For example, when the delay circuit 21 and the dummy delay circuit 81A are set to a minimum amount of delay and the count value is greater than the expected value, the delay of the delay circuit 21 may be increased. When the delay time of the delay circuit 21 is maximum amount within a variable range and the count value is greater than the expected value, the delay of the dummy delay circuit 81A may be increased.

Figure 16:
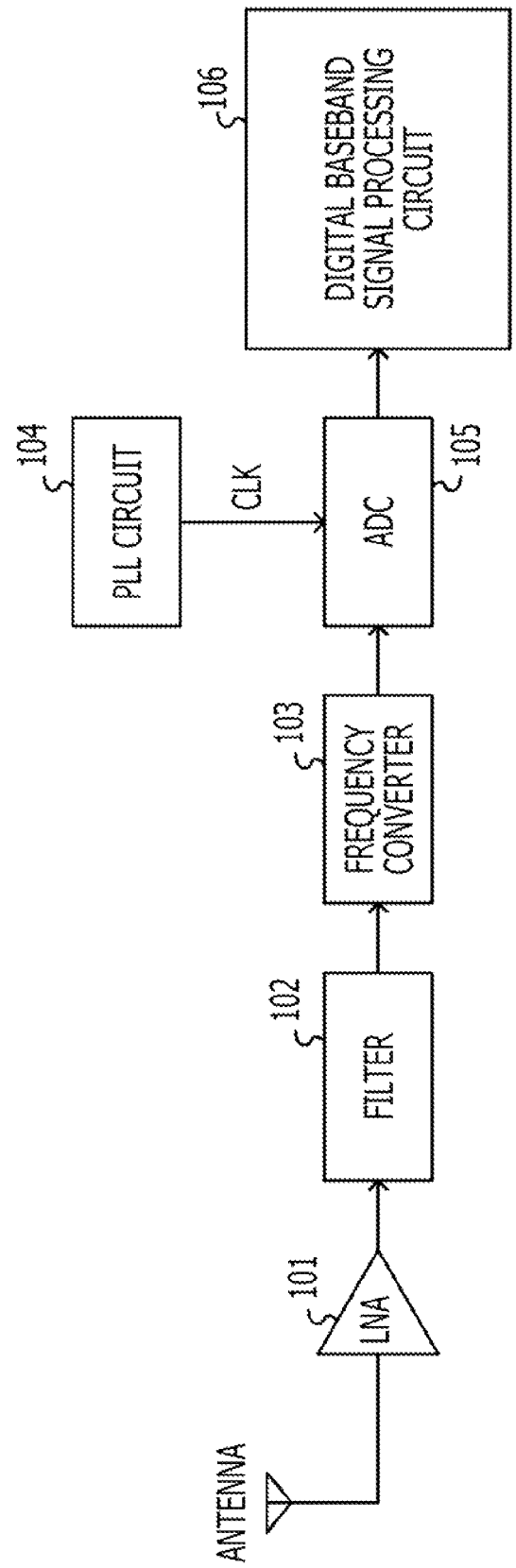
FIG. 16 illustrates an exemplary receiving system in a radio communication device.

FIG. 16 illustrates an exemplary receiving system in a radio communication device. The receiving system illustrated in FIG. 16 includes a low noise amplifier (LNA) 101, a filter 102, a frequency converter 103, an analog-to-digital converter circuit (ADC) 105, a PLL circuit 104, and a digital baseband signal processing circuit 106. A radio frequency (RF) signal received by an antenna is amplified by the LNA 101, and the frequency of the amplified signal is converted by the frequency converter 103 to a frequency selected by the filter 102. The analog signal obtained after frequency conversion is converted into a digital signal by the ADC 105. The ADC 105 performs digital conversion in synchronization with a clock signal CLK generated by the PLL circuit 104. The clock signal CLK may be a clock signal with a duty ratio of 50%. The digital baseband signal processing circuit 106 performs digital baseband signal process on the digital signal obtained after AD conversion. For example, the successive approximation register AD converter 10 illustrated in FIG. 1 may applied to the ADC 105 in the receiving system.

All examples and conditional language recited herein are intended for pedagogical objects to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

The invention claimed is:

1. A successive approximation register analog-to-digital converter comprising:
    a digital-to-analog converter to generate an analog voltage based on an input voltage and a digital code, the input voltage being sampled in accordance with a sampling clock;
    a comparator to receive the analog voltage;
    a controller to generate the digital code based on an output of the comparator;
    a delay circuit to delay a signal based on the output of the comparator and to feed back the delayed signal to a reset terminal of the comparator;
    an adjustment circuit to count a number of edges of a signal generated in a loop that feeds back the delayed signal during a period having an integer multiple of a cycle of an external clock signal, and to adjust an amount of delay of the delay circuit based on a count value; and
    a sampling clock generation circuit to generate the sampling clock based on the signal generated in the loop and the external clock signal.

2. The successive approximation register analog-to-digital converter according to claim 1,
    wherein the generation circuit generates the sampling clock based on the external clock signal and a timing when a first number of edges of the signal are generated.

3. The successive approximation register analog-to-digital converter according to claim 1,
    wherein the adjustment circuit adjusts the amount of delay of the delay circuit so that the count value is substantially equal to a sum of a number of bits of the digital code and a second number.

4. The successive approximation register analog-to-digital converter according to claim 2,
    wherein the first number is substantially equal to a number of bits of the digital code.

5. The successive approximation register analog-to-digital converter according to claim 1,
    wherein the loop includes a first loop where the signal based on the output of the comparator, which is delayed by the delay circuit, is fed back to the reset terminal of the comparator.

6. The successive approximation register analog-to-digital converter according to claim 5, further comprising:
    a second feedback loop to return an output of the delay circuit to an input of the delay circuit via a dummy delay circuit,
    wherein the first loop is switched to the second feedback loop during a cycle of the external clock signal.

7. The successive approximation register analog-to-digital converter according to claim 6,
    wherein the delay circuit is separated from the first loop in the second feedback loop, and the comparator is stopped.

8. The successive approximation register analog-to-digital converter according to claim 1,
    wherein the controller changes the digital code in synchronization with the output of the comparator.

9. The successive approximation register analog-to-digital converter according to claim 1,
    wherein the digital-to-analog converter includes a capacitor digital-to-analog converter.

10. A clock adjustment method comprising:
    generating an analog voltage based on an input voltage and a digital code, the input voltage being sampled in accordance with a sampling clock;
    performing a comparison operation based on the analog voltage by using a comparator;
    generating the digital code based on an output of the comparator;
    delaying a signal based on the output of the comparator by using a delay circuit;
    feeding back the delayed signal to a reset terminal of the comparator;
    measuring a number of edges of a signal generated in a loop that feeds back the delayed signal during a period having an integer multiple of a cycle of an external clock signal;
    adjusting an amount of delay of the delay circuit based on a count value; and
    generating the sampling clock based on the signal generated in the loop and the external clock signal.

11. The clock adjustment method according to claim 10, further comprising:
    generating the sampling clock based on the external clock signal and a timing when a first number of edges of the signal are generated.

12. The clock adjustment method according to claim 10, further comprising:
    adjusting the amount of delay so that the count value is substantially equal to a sum of the number of bits of the digital code and a second number.

13. The clock adjustment method according to claim 10,
    wherein the first number is substantially equal to the number of bits of the digital code.

14. The clock adjustment method according to claim 10, further comprising:
    forming a first feedback loop which feeds back the signal based on the output of the comparator, which is delayed by the delay circuit, to the reset terminal of the comparator.

15. The clock adjustment method according to claim 14, further comprising:
    switching the first feedback loop to a second feedback loop which returns an output of the delay circuit to an input of the delay circuit via a dummy delay circuit in a cycle of the external clock signal.

16. A signal processing system comprising:
a phase locked loop circuit to generate a clock signal;
a successive approximation register analog-to-digital converter to operate in accordance with the clock signal; and
a digital signal processing circuit to process an output of the successive approximation register analog-to-digital converter,
wherein the successive approximation register analog-to-digital converter includes:
a digital-to-analog converter to generate an analog voltage based on an input voltage and a digital code, the input voltage being sampled in accordance with a sampling clock;
a comparator to receive the analog voltage;
a digital-to-analog converter control circuit to generate the digital code based on an output of the comparator;
a delay circuit to delay a signal based on the output of the comparator and to feed back the delayed signal to a reset terminal of the comparator;
a delay amount adjustment circuit to count a number of edges of a signal generated in a loop that feeds back the delayed signal during a period having an integer multiple of a cycle of an external clock signal, and to adjust an amount of delay of the delay circuit based on a count value; and
a sampling clock generation circuit to generate the sampling clock based on the signal generated in the loop and the external clock signal.

17. The signal processing system according to claim 16, wherein the sampling clock generation circuit generates the sampling clock based on the external clock signal and a timing when a first number of edges of the signal are generated.

18. The signal processing system according to claim 16, wherein the delay amount adjustment circuit adjusts the amount of delay of the delay circuit so that the count value is substantially equal to a sum of the number of bits of the digital code and a second number.

19. The signal processing system according to claim 17, wherein the first number is substantially equal to the number of bits of the digital code.

20. The signal processing system according to claim 17, further comprising:
a second feedback loop to return an output of the delay circuit to an input of the delay circuit via a dummy delay circuit,
wherein a first loop where the signal based on the output of the comparator, which is delayed by the delay circuit, is fed back to the reset terminal of the comparator, is switched to the second feedback loop during a cycle of the external clock signal.

* * * * *